United States Patent [19]
Whidden

[11] 4,368,539
[45] Jan. 11, 1983

[54] TRANSMITTER DETECTOR

[76] Inventor: Glenn H. Whidden, 13214 L'Enfant Dr., Oxon Hill, Md. 20022

[21] Appl. No.: 180,484

[22] Filed: Aug. 22, 1980

[51] Int. Cl.³ .................... H03J 7/18; H04B 17/00; H04B 1/16

[52] U.S. Cl. .................... 455/166; 455/226; 455/227; 324/77 C

[58] Field of Search .......... 455/145, 147, 154, 158, 455/161, 164, 166, 169, 226–228; 324/77 A, 77 C, 77 B, 77 CS, 79 D; 343/55 A, 18 E

[56] References Cited

U.S. PATENT DOCUMENTS

| 3,449,749 | 6/1969 | McEvoy | 324/77 C |
| 3,473,127 | 10/1969 | Williams et al. | 455/228 |
| 3,701,949 | 10/1972 | Turkish | 455/147 |
| 3,932,814 | 1/1976 | Niki | 455/147 |
| 4,001,695 | 1/1977 | Hrbacek et al. | 324/77 C |
| 4,063,169 | 12/1977 | Palmer | 324/77 CS |
| 4,063,179 | 12/1977 | Brown | 455/166 |
| 4,118,666 | 10/1978 | Bernstein | 324/77 C |
| 4,238,727 | 12/1980 | Madni | 324/77 B |

OTHER PUBLICATIONS

"Scanlock Mark VB", Publication from Technical Services Agency, Inc.

Primary Examiner—Jin F. Ng
Attorney, Agent, or Firm—Cushman, Darby & Cushman

[57] ABSTRACT

Method and apparatus for detecting a transmitter. The harmonics of an incrementally increasing fundamental frequency are mixed with input signals thus forming intermediate frequency signals. Frequencies occupied by background transmitters are identified by surveying the r-f spectrum at a remote point; these frequencies are then bypassed when scanning is performed in the area to be secured. Another method is also disclosed wherein an operator scans the r-f spectrum in an area, and records indications corresponding to the frequencies of signals not emanating from eavesdropping devices so that those frequencies will be bypassed on subsequent scans.

31 Claims, 1 Drawing Figure

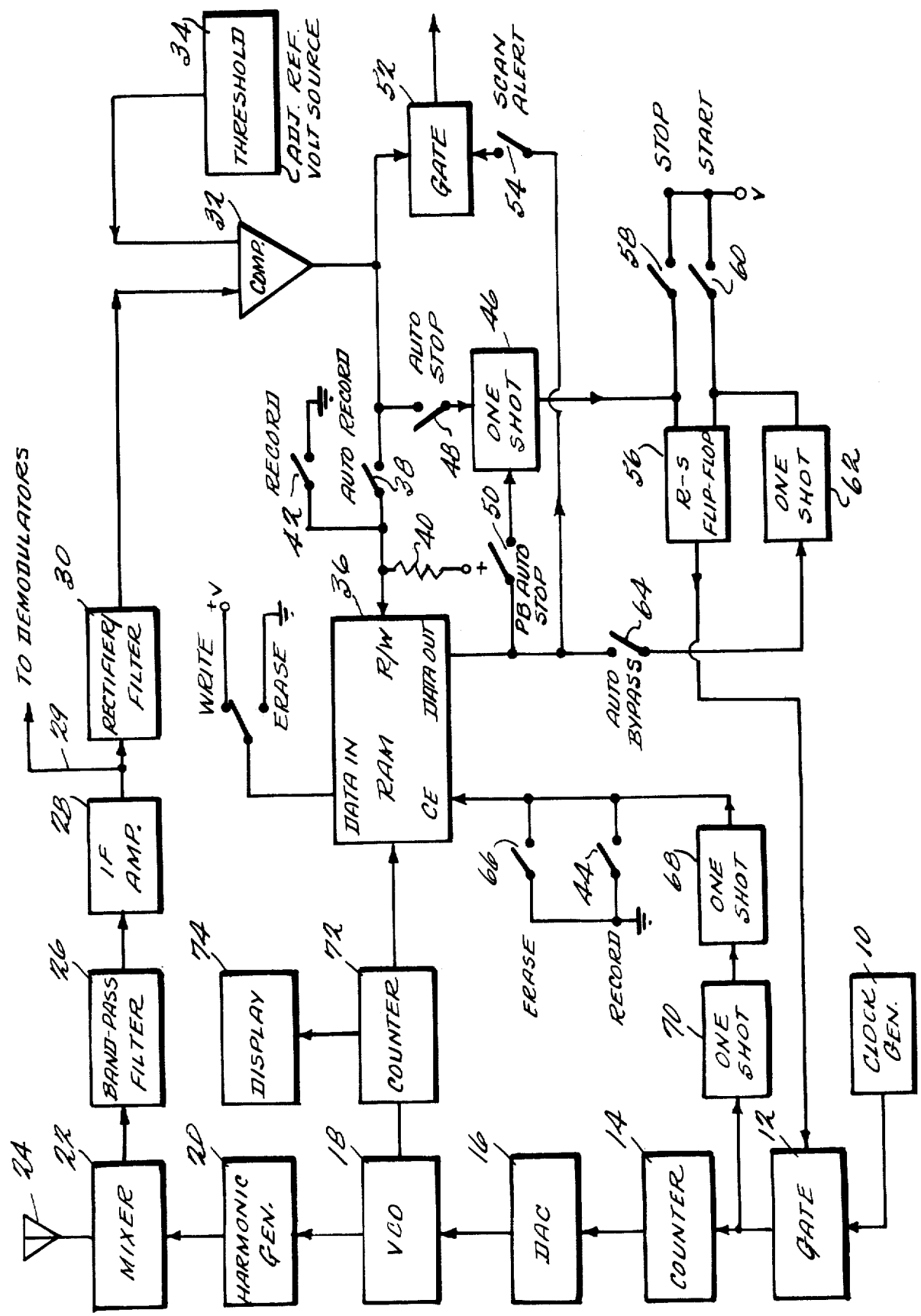

TRANSMITTER DETECTOR

BACKGROUND OF THE INVENTION

1. Field of Invention

This invention relates generally to a method and apparatus for detecting the presence of a transmitter, particularly a covert eavesdropping transmitter by detecting the radio frequency (r-f) signal it broadcasts.

2. Summary of the Prior Art

Several methods and devices for detecting the r-f signal emitted by the transmitter of a concealed eavesdropping device are known in the art. Field strength meters measure the intensity of radio transmissions at the frequency to which they are tuned. By scanning a range of frequencies, either manually or with the aid of a computer or the like, an operator can detect signals as peaks in the r-f spectrum.

Signal detection is only half of the task, however. An operator must also assess signal content in order to distinguish between signals from legitimate transmitters (safe signals) and signals from eavesdropping devices. For this reason, field strength measuring devices are often used in conjunction with countermeasures receivers. A countermeasures receiver is simply a radio receiver adapted to meet the special requirements of bug detection. Thus, such a device would typically have high sensitivity and selectivity over the useable r-f spectrum, and multiple-mode demodulation capability. See Van Dewerker, *State of the Art of Electronic Surveillance*, NWC Commission Studies p. 190 (1976).

The operation of these prior art devices gives rise to several disadvantages. First, the equipment must generally be operated by a highly-trained individual. Second, the entire useable r-f spectrum must be scanned. Insofar as the range of the spectrum which should be searched is considerably broader than the commercial radio band of 88 to 108 MHz, it is easy to imagine that such a task can be extremely time-consuming. Even when a computer performs the signal detection, the human operator must monitor signal content continually over the time period one desires to keep a given area free of eavesdropping devices.

To avoid the need of constant human monitoring, some devices provide for demodulating the intercepted signal and channelling it into the area being checked by means of a loudspeaker. If the signal in question emanates from an eavesdropping device, the device will pick up its own signal, ultimately causing a feedback squeal. One such device is disclosed in U.S. Pat. No. 3,473,127 granted to Williams on Oct. 14, 1969. This remedy has its own disadvantage, however, in that this feedback squeal unavoidably alerts the eavesdropper that detection efforts are being undertaken. Alerting the eavesdropper is undesirable because the eavesdropper may then turn off the eavesdropping device, making the exact location of the bug and the listening post impossible to discern electronically.

Another method directed towards eliminating the need of constant human monitoring involves using a search signal of well defined frequency produced by a loudspeaker in the area to be checked. If a covert eavesdropping device is present, it will pick up and transmit this tone; a countermeasures receiver attuned to the tone frequency can then detect this transmitted signal. Such a method and a device for implementing it are disclosed in U.S. Pat. No. 3,939,420 granted to Risberg et al on Feb. 17, 1976. This method also suffers from the disadvantage that the search signal may alert the eavesdropper. Also, as in the feedback method, the generation of an audible signal in the area to be secured makes the continued operation of these devices during the course of confidential communications impractical.

SUMMARY OF THE INVENTION

In the present invention, a fundamental frequency and its harmonics are simultaneously mixed with incoming signals in a superheterodyne receiver. The fundamental frequency then needs only to be varied between a base frequency and its first harmonic. Thus, scanning is more efficient and less time consuming. The redundancy inherent in such a scanning method also lessens the probability that a signal will go undetected.

In a initialization mode, when a signal of a predetermined strength passes through the intermediate frequency (IF) section of the receiver, scanning may be stopped at the frequency of the strong signal. An operator may then monitor the signal to determine if it is "safe". If it is the operator may then cause a bit to be stored in a memory at an address related to the fundamental frequency. Alternatively, in the initialization mode, the device may be positioned at a point sufficiently far from the area to be searched that a signal from an eavesdropping transmitter within the area will not propagate to the point. Then, a bit may be automatically stored in the memory every time a strong signal is received.

In either case, when the device is disposed in the area to be searched, it will stop scanning only at signals having frequencies whose related fundamental frequencies have not been stored in the memory. These signals may emanate from eavesdropping transmitters.

Thus, the present invention overcomes the need for constant human monitoring through provision for by-passing, during scanning, frequencies occupied by safe signals determined to originate from legitimate, background transmitters. After a simple initialization procedure, the operator need only monitor new signals appearing in the spectrum as the device detects them. Since an audible, room-filling tone need not be produced, the eavesdropper is not alerted, and the device can continue to operate in an area to be secured without interfering with conversations. The need for a trained operator is also minimized.

As will be described, the present invention may also be employed to study the utilization of the r-f spectrum. In this mode of operation unoccupied radio frequencies may be identified.

BRIEF DESCRIPTION OF THE DRAWING

These and other objects and advantages of the invention will become more apparent and more readily appreciated from the following detailed description of the presently preferred exemplary embodiment of the invention taken in conjunction with the accompanying drawing which is a block diagram of a transmitter detector according to the present invention.

DETAILED DESCRIPTION OF THE PREFERRED EMBODIMENT

As illustrated in the drawing, a transmitter detector according to the present invention includes a clock 10 which, through gate 12, increments counter 14. In the preferred embodiment counter 14 is a 12-bit counter. Counter 14 is connected to digital-to-analog counter (DAC) 16, which in the preferred embodiment is a device such as the DAC 80 manufactured by Analog Devices, Inc. The output of DAC 16 controls the frequency of the output of voltage controlled oscillator (VCO) 18. In the preferred embodiment each pulse from clock 10 causes the output of VCO 18 to change by 1.95 KHz. The output of VCO 18 is connected to harmonic generator 20, which in the preferred embodiment includes PIN diodes. The output of harmonic generator 20, which consists of a fundamental frequency from VCO 18 and the harmonics thereof, is connected to one of the inputs of mixer 22. The leads from antenna 24 are connected to the other input of mixer 22.

The output of mixer 22 is connected to bandpass filter 26. The output of bandpass filter 26 is connected to intermediate frequency (IF) amplifier 28, which in the preferred embodiment is an RCA CA2111. Filter 26 and amplifier 28 are tuned, in the preferred embodiment, to a band of 300 KHz centered at 2 MHz. The output of IF amplifier 28 is connected to rectifier/filter combination 30 which, in the preferred embodiment, is a standard automatic gain control (agc) sensing circuit. The output of IF amplifier 28 is also connected to signal demodulaters (not shown) through line 29. The output of rectifier/filter combination 30 is connected to one of the inputs of comparator 32, the other input of which is connected to adjustable reference voltage source 34.

The output of comparator 32 is connected to three elements. First the output is connected to the read/-write (R/W) input of random access memory (RAM) 36 through auto-record switch 38. Second, the output of comparator 32 is connected to the input of monostable multivibrator (one-shot) 46 through auto-stop switch 48. Another input of one-shot 46 is also connected to the data output of RAM 36 through playback auto-stop switch 50. Finally the output of comparator 32 is connected to an input of gate 52, which may be an AND gate. The other input of gate 52 is connected to the data output of RAM 36 through scan alert switch 54.

The R/W input of RAM 36 is also connected to a high logic voltage through resistor 40. The R/W input of RAM 36 may be momentarily connected to a low logic voltage through normally open/momentary close manual record switch 42. Switch 42 is ganged with manual record switch 44, which momentarily connects the chip enable (CE) input of RAM 36 to a low logic voltage.

The output of one-shot 46 is connected to the set input of RS flip-flop 56, which is also connected to a low logic voltage through stop switch 58. The reset input of RS flip-flop 56 is connected to a low logic voltage signal through start switch 60 and to the output of one-shot 62, whose input is connected to the data output of RAM 36 through auto-bypass switch 64. The output of RS flip-flop 56 is connected to the control terminal of gate 12.

The CE input of RAM 36, in addition to being connected to a low logic voltage through switch 44 as described above, is also connected to a low logic voltage through erase switch 66. The CE input of RAM 36 is also connected to the output of one-shot 68, whose input is connected to the output of one-shot 70. The input of one-shot 70 is, in turn, connected to the output of clock 10 through gate 12. The address inputs of RAM 36 are connected to the output of frequency counter 72, which in the preferred embodiment is a 12-bit device. The input of frequency counter 72 is connected to the output of VCO 18. The output of frequency counter 72 is also connected to the input of display 74.

The data input of RAM 36 may be connected to either a high or low logic voltage through record/erase switch 76, which connects the data input of RAM 36 to a high logic voltage in the record mode. Thus when comparator 32 produces an output while auto-record switch 38 is closed, a bit is stored in memory 36 at an address corresponding to the fundamental frequency generated by VCO 18. One-shots 70 and 68 form a time delay so that RAM 36 is enabled after the signal from comparator 32 has stabilized.

Bits stored in RAM 36 may also be selectively erased. To accomplish this, the device is stopped (by stop switch 58) when display 74 indicates the proper location is addressed. Record/erase switch 76 is moved to a position so that the data input of RAM 36 is connected to a low logic voltage. Manual record switches 42 and 44 are then closed. This causes a low voltage to be written in RAM 36. Since high voltages are used as indicators, the entry of a low voltage effectively erases the indicator bit.

The transmitter-detector apparatus of the present invention lends itself to several different methods of countermeasures surveillance. The user may select a mode of operation best suited to the surveillance method chosen. In the ensuing description, separate modes of operation will be discussed separately for the sake of clarity.

The first mode of operation possible with the apparatus might be called the monitored initialization-/automatic scanning mode.

During an initialization period, r-f signals are picked up by antenna 24 and conveyed to mixer 22, where it is mixed with signals from harmonic generator 20. The signals from mixer 22 are filtered by bandpass filter 26 and then selectively amplified by IF amplifier 28. If any of the r-f signals happen to produce a 2 MHz signal when mixed with the output of harmonic generator 20, the 2 MHz signal is amplified by IF amplifier 28 and is then rectified and filtered in rectifier/filter 30. The output of rectifier/filter 30 is compared in comparator 32 with a reference voltage determined by adjustable reference voltage source 34.

If the signal from rectifier/filter 30 exceeds the reference voltage, comparator 32 produces an output signal. In this mode of operation auto-stop switch 48 is closed. Thus, when mixer 22 produces a sufficiently strong 2 MHz IF signal, the output from comparator 32 causes one-shot 46 to produce a pulse which sets RS flip-flop 56. The output of RS flip-flop 56 causes gate 12 to stop conducting, so that pulses from clock 10 are not passed to the output of gate 12.

Thus, when gate 12 ceases conduction, counter 14 stops incrementing so that DAC 16 continues to produce the same output voltage, and VCO 18 remains locked on the fundamental frequency giving rise to the detection. This frequency is digitized by frequency counter 72. Display 74 connected to an output of frequency counter 72 provides a visual display of the fundamental frequency.

With the device idling at a suspect frequency, the operator may monitor the suspect signal. Once he is assured that the signal is safe, he momentarily closes manual record switches 42 and 44. This causes a high signal to be stored at an address in RAM 36 representative of the fundamental frequency. The operator then closes start switch 60 to reset flip-flop 56, thus re-enabling gate 12, and scanning resumes.

Once the entire usable r-f spectrum (in the preferred embodiment frequencies lying between 10 MHz and 2 GHz) has been scanned, and memory addresses corresponding to the frequencies of safe signals have been loaded, the operator closes auto-bypass switch 64. Then the operator momentarily closes start switch 60 to begin scanning. Each time a signal is detected, the output of comparator 32 causes one-shot 46 (through auto-stop switch 48) to set flip-flop 56, thus stopping scanning. However, if the r-f signal is a safe signal so that the corresponding fundamental frequency has been stored in RAM 36, the data output of RAM 36 will produce a signal, due to an enabling signal from gate 12. One-shots 68 and 70 interact to delay the signals from gate 12. The signal from RAM 36 causes one-shot 62 to reset RS flip-flop 56, restarting scanning. If the detected r-f signal was not processed in the initialization step, RAM 36 will not produce a signal, and the device will freeze at the suspect frequency so that the operator may monitor it.

The second method of operation which may be implemented with a device according to the present invention might be called the remote initialization/automatic scanning mode. The operator initializes the device by scanning the r-f spectrum at a point remote enough from the area to be searched that no eavesdropping signal transmitted from the area to be searched is likely to propagate to the initialization point at a detectable strength. The device scans automatically; there is no need for the operator to monitor the signals. When an r-f signal is encountered, the device automatically stores a signal at a memory address corresponding to the fundamental frequency at which the detection was made, and then continues scanning. Once the entire useable r-f spectrum has been scanned, the instrument is placed in the area to be checked. If it encounters signals in this area not corresponding to any of the signals already registered, it will automatically cease tuning, affording the operator an opportunity to monitor the signal.

Referring again to the drawing, in the initialization period of this mode of operation, auto-stop switch 48 is open, auto-record switch 38 is closed and auto-bypass switch 64 is open. Thus, a signal from comparator 32, produced as an indication of a detection, is conveyed directly to the read/write input of RAM 36, while at the same time one-shots 68 and 70 produce a pulse which enables RAM 36. Thus, RAM 36 automatically stores a bit at an address corresponding to the fundamental frequency giving rise to the detection. Note that tuning is not halted because auto-stop switch 48 is open.

Once several scans have been completed, the operator ceases tuning by momentarily closing stop switch 58. The instrument is then transferred to the area to be checked. Auto-stop switch 48 and auto-bypass switch 64 are closed, and auto-record switch 38 is open. The operation is then identical to the automatic scanning of the first mode of operation described above. If a signal is encountered for which a bypass bit has not been loaded into memory 36, RS flip-flop 56 will not reset, and tuning will halt providing the operator with an opportunity to monitor the signal. If the signal is determined to be safe, the operator may manually load a bypass bit into RAM 36 by depressing record switches 42 and 44. The operator can then cause the preferred embodiment to resume tuning by momentarily closing start switch 60.

A third mode of operation of the preferred embodiment of the present invention is the scanning of preselected frequencies. In this mode, auto-record switch 38 and auto-stop switch 48 are opened so that the device neither records nor stops automatically. The operator manually loads bypass bits at address corresponding to fundamental frequencies which would give rise to detections of the frequencies of interest. This is accomplished by first momentarily closing start switch 60 to cause counter 14 to begin incrementing. When VCO 18 produces a fundamental frequency which the operator desires to scan, he depresses stop switch 59 so that the output frequency of VCO 18 does not change. He then momentarily depresses record switches 42 and 44 to store a bit in RAM 36 at an address corresponding to the fundamental frequency.

Once this is done, the operator closes scan alert switch 54, and opens auto-stop switch 48, auto-record switch 38 and auto-bypass switch 64. When a signal is detected, the output of comparator 32 is applied to gate 52, and if its fundamental frequency corresponds to one of the fundamental frequencies loaded in the initialization step, gate 52 will pass the bit outputted by RAM 36 to devices which can be used to alert the operator. If it is desired to halt scanning when an output signal is generated by gate 52, the signal may be directed to the set terminal of flip-flop 56. When flip-flop 56 becomes set by the signal from gate 52, gate 12 is disabled so that counter 14 cannot increment.

In this third mode of operation, to determine the proper VCO 18 frequencies at which bits should be stored so that the preselected frequencies are scanned, the operator adds or subtracts the preselected frequency from the IF frequency of the device. The resulting frequency is divided by a whole number to produce a frequency that is within the tuning range of VCO 18. If VCO 18 operates at the frequency identified by this procedure, any signal with the preselected frequency will pass through the IF stage and may be applied to demodulators connected to line 29.

In a fourth mode of operation, the preferred embodiment can be employed to obtain the r-f spectrum energy distribution in an area. In this mode of operation, auto-record switch 38 is closed and auto-bypass switch 64, auto-stop switch 48 and playback auto-stop switch 50 are opened. The device is started by depressing start switch 60 and is left to run for an extended period of time. During this period, every r-f signal detected by comparator 32 causes a bit to be recorded in RAM 36 at an address corresponding to the fundamental frequency produced by VCO 18.

At the end of the recording period, the device is stopped by depressing stop switch 58. Playback auto-stop switch 50 is closed and auto-record switch 38 is opened. The device is then started by depressing start switch 60. Counter 14 will be incremented and the frequency of the VCO 18 will increase until it reaches a frequency which produces an output from RAM 36. This output triggers one-shot 46 which sets flip-flop 56 to stop the device. The operator can then record this frequency and restart this device. This process continues until all bits in RAM 36 have been readout.

In addition to the methods already described, it is readily apparent that the device may be used in many other ways. For example, an operator can use the device in the first mode described to monitor the r-f spectrum as he travels and thus detect signals used by individuals attempting to keep the operator under surveillance.

As will be appreciated by those skilled in the art, the preferred embodiment of the present invention incorporates a superheterodyne receiver in that it includes a local oscillator (VCO 18) and mixer 22 which are followed by an intermediate frequency amplifier (28). In the preferred embodiment, however, a number of harmonically related signals (of which the output of VCO 18 is the fundamental) are fed to mixer 22. The fundamental and harmonics are applied to mixer 22 simultaneously, which means that the device is capable of receiving and converting to the intermediate frequency, a number of signals at the same time. It also means that the device scans a large part of the spectrum as the frequency of VCO 18 changes by a relatively small amount. In addition, as VCO 18 is scanned, first one harmonic of one fundamental frequency and then the next harmonic of another fundamental frequency will cause any given incoming signal to produce the IF at the output of mixer 22. Because of these harmonics, however, the frequency of the incoming signal cannot be determined in the normal way, (i.e. through $F=LO \pm IF$, where F is the frequency of the incoming signal, LO is the frequency of the local oscillator and IF is the intermediate frequency). With the present invention, it is necessary to know the frequency of VCO 18 (VCO) and the harmonic (n) of it that is mixed with the incoming signal to produce the intermediate frequency. Fortunately, there is a method of determining which harmonic is producing the desired results. It involves knowing the VCO 18 frequency at two or more places where the unknown signal is received. As an example, in the preferred embodiment, VCO 18 tunes from 12 to 20 MHz and an IF amplifier 28 passes signals at 2 MHz. There is no frequency selectively between antenna 24 and mixer 22 and therefore there is no image rejection.

A study of the spectrum covered by the preferred embodiment reveals that there is a special relationship between the harmonic frequencies for any given incoming signal. In effect, there is only one incoming frequency that can appear as an IF signal at any given spacing of harmonics at any given harmonic frequency.

For example, suppose that a signal is received at 105.9 MHz. This signal will produce an IF signal at different harmonics of a number of VCO 18 frequencies. Thus:

8th harmonic of 12.9875 = 103.9 MHz
8th harmonic of 13.4875 = 107.9 MHz
7th harmonic of 14.8429 = 103.9 MHz
7th harmonic of 15.4143 = 107.9 MHz
6th harmonic of 17.3167 = 103.9 MHz
6th harmonic of 17.9833 = 107.9 MHz
105.9 − 103.9 = 2 MHz
107.9 − 105.9 = 2 MHz Therefore as VCO 18 is tuned from 12 to 20 MHz, the signal at 105.9 MHz is detected 6 times. If it is desired to bypass 105.9 MHz to "eliminate" a signal at that frequency, it is therefore necessary to cause the device to bypass the 6 frequencies listed above.

The question then arises as to what other signal frequencies will be bypassed as well when that is done. Thus, when 12.9875 MHz is bypassed, the signal frequency of 118.8875 MHz (the ninth harmonic of 12.9875 MHz) will also be bypassed as will others. 118.8875 MHz will not be totally eliminated however, because it will be received when VCO 18 is at 14.6109 (the eighth harmonic of 14.6109 is 118.8875). This illustrates that there appears to be only *one combination* of harmonic frequencies that, when bypassed during tuning, will "eliminate" all of a given signal frequency. Other signal frequencies will be received on a different combination and therefore will not be "eliminated".

Therefore, in this mode of operation, if, in the initialization phase, as operator records a fundamental frequency which has one harmonic which produces an intermediate frequency amplifier 30 output when mixed with a "safe" incoming signal, in the operation phase, an eavesdropping transmitter operating at a different harmonic of the same fundamental will be masked. However, research has shown that any such masked eavesdropping transmitter signal will be received as a different harmonic of another fundamental frequency.

The following is one method for calculating an incoming signal frequency when two adjacent VCO 26 frequencies are known that produce reception. "Adjacent frequencies" refers to two fundamental frequencies wherein the $n^{th}$ harmonic of the one and the $(n+1)^{th}$ harmonic of the other produce reception. Where two adjacent VCO 26 frequencies A and B are known at which the unknown signal frequency is acquired, $$B - A = X$$

$$(1/X)(A) = n \text{ (the harmonic)}$$

For example, if the signal is detected at adjacent VCO 18 frequencies of 14.8429 and 12.9875, $14.8429 - 12.9875 = 1.8554$ $$n = \frac{1}{1.8554} \times 12.9875$$

$$= 7$$

The unknown signal frequency is then found from:

$$F = (B)(n) + LO$$

where LO is the intermediate frequency, which in the preferred embodiment is 2 MHz $$= (14.8429 \times 7) + 2$$

$$= 103.9 + 2$$

$$= 105.9 \text{ MHz}$$

Other combinations of VCO 18 frequencies can also be arithmetically manipulated to determine the signal frequency.

Thus, it will be readily appreciated by those skilled in the art, that many modifications are possible in both method and apparatus without materially departing from the novel teachings and advantages of this invention. For example, circuitry could be added to perform automatically the algorithm for calculating signal frequency from two or more fundamental frequencies. Accordingly, all such modifications are intended to be included within the scope of this invention as defined by the following claims:

What is claimed is:

1. A method of detecting the presence of a transmitter in an area comprising the steps of:
    monitoring at least a portion of a radio frequency spectrum at an initialization point far enough removed from said area that no signal originating in said area and propagating to said initialization point is likely to have a strength greater than a predetermined amount;

determining first frequencies related to frequencies at which signals are received at said initialization point having a strength greater than said predetermined amount; then storing said determined first frequencies in a memory device;

monitoring said at least a portion of the radio frequency spectrum in said area;

determining second frequencies related to frequencies at which signals are received in said area; and comparing said stored first frequencies with said second frequencies to identify frequencies determined in said area not determined at said initialization point, said identified frequencies being indicative of the presence of a transmitter in said area.

2. The method of claim 1 wherein at least one of said monitoring steps includes the steps of:

generating a scanning signal consisting of frequency components related to a base frequency;

combining said scanning signal with input signals to generate mixed signals; and selectively amplifying a particular frequency band of said mixed signals.

3. The method of claim 1 wherein at least one of said monitoring steps includes the steps of:

generating a scanning signal consisting of a fundamental signal and a plurality of harmonics thereof;

combining said scanning signal with input signals to generate mixed signals; and selectively amplifying a particular frequency band of said mixed signals.

4. The method of claim 1 further comprising the step of storing indications of said signals received at said initialization point in a memory at addresses corresponding to said first frequencies.

5. The method of claim 4 wherein said comparing step further comprises the steps of:

determining for each of said second frequencies, whether an indication is stored in said memory at an address corresponding to one of said first frequencies related to said second frequency; and halting said second frequency determining step when said indication determining step proves negative.

6. The method of claim 5 wherein said comparing step further comprises the steps of:

analyzing the data carried at said second frequency after said halting step;

storing an indication in said memory at an address corresponding to one of said first frequencies related to said second frequency; and restarting said second frequency determining step.

7. A method of detecting the presence of a transmitter in an area to be secured from transmitters comprising the steps of:

(a) generating a scanning signal consisting of frequency components related to a base frequency;

(b) combining said scanning signal with input signals to generate mixed signals;

(c) selectively amplifying a particular frequency band of said mixed signals;

(d) determining whether said amplified mixed signals exceed a predetermined threshold;

(e) storing an indication in a memory at an address related to said base frequency of said amplified mixed signals which exceed said predetermined threshold;

(f) analyzing said amplified mixed signals which exceed said predetermined threshold to determine whether the data was transmitted from a transmitter in said area;

(g) incrementally varying the frequency of said base frequency; and (h) repeating said steps (a)–(g) bypassing said frequencies which said analyzing step determines contains data transmitted from outside said area on subsequent ones of said determinating steps.

8. A method as in claim 7 wherein said frequency components are harmonics of said base frequency.

9. A method of determining radio frequencies carrying signals which exceed a predetermined threshold comprising the steps of:

(a) generating a scanning signal consisting of frequency components related to a fundamental signal having a frequency;

(b) combining said scanning signal with input signals to generate mixed signals;

(c) selectively amplifying a particular frequency band of said mixed signals;

(d) determining which of said amplified mixed signals exceeds a predetermined threshold;

(e) storing an indication of amplified mixed signals which exceed said predetermined threshold in a memory at an address related to said fundamental signal frequency of said scanning signal giving rise to said indication;

(f) incrementally varying said fundamental signal frequency and said frequency components;

(g) repeating said steps (a), (b), (c), (d), (e) and (f) a plurality of times; and (h) reading said memory to determine which of said addresses contain said indication, said addresses storing said indications being related to radio frequencies carrying signals.

10. A method of determining radio frequencies carrying signals exceeding a predetermined threshold comprising the steps of:

(a) generating a scanning signal including a plurality of harmonics of a fundamental signal;

(b) combining said scanning signal with input signals to generate mixed signals;

(c) selectively amplifying a particular frequency band of said mixed signals;

(c) determining if said amplified mixed signal exceeds a predetermined threshold;

(e) storing an indication in a memory at an address related to the frequency of said fundamental signal giving rise to said indication when said amplified mixed signal exceeds said predetermined threshold;

(f) incrementally varying the frequency of said fundamental signal;

(g) repeating said steps (a), (b), (c), (d), (e), and (f) a plurality of times; and (h) reading said memory to determine which of said addresses contain said indication, said addresses storing said indications being related to radio frequencies carrying signals.

11. A method of monitoring predetermined frequencies for signals, the transmitted energy of which exceeds a predetermined threshold comprising the steps of:

(a) loading first indications in a memory at addresses corresponding to base frequencies related to said predetermined frequencies;

(b) generating a fundamental signal having a base frequency;

(c) generating a scanning signal consisting of a plurality of second frequencies related to said base frequency;

(d) combining said scanning signal with input signals to generate mixed signals;

(e) selectively amplifying a particular frequency band of said mixed signals;

(f) providing a second indication of said amplified mixed signals exceeds said predetermined threshold;

(g) reading said memory at an address corresponding to said base frequency;

(h) analyzing data transmitted at said predetermined frequencies related to said base frequency when said first indication is stored at said corresponding address and said second indication is provided;

(i) incrementally varying said base frequency and said second frequencies; and (j) repeating said steps (b), (c), (d), (e), (f), (g), (h), and (i) a plurality of times.

12. A method of monitoring predetermined frequencies for signals the transmitted energy of which exceeds a predetermined threshold comprising the steps of:

(a) loading first indications in a memory at addresses corresponding to said predetermined frequencies prior to any of succeeding steps (b) through (k);

(b) generating a scanning signal having a frequency;

(c) combining said scanning signal with input signals to generate mixed signals;

(d) selectively amplifying a particular frequency band of said mixed signals;

(e) determining whether said amplified mixed signals exceed a predetermined threshold;

(f) providing a second indication when said amplified mixed signals exceed said predetermined threshold;

(g) reading said memory at an address corresponding to the frequency of said scanning signal when said second indication is provided;

(h) determining whether a first indication had previously been stored at said address read out in said step (g);

(i) analyzing data transmitted at said predetermined frequencies related to the frequency of said scanning signal when said first indication is stored at said address and said second indication is provided;

(j) incrementally varying the frequency of said scanning signal; and (k) repeating said steps (b), (c), (d), (e), (f), (g), (h), (i) and (j) a plurality of times.

13. An apparatus for detecting the presence of a transmitter comprising:

first means for generating a local signal having a varying frequency;

means for receiving incoming signals;

means for combining said incoming signals with said local signal to produce mixed signals;

means for selectively amplifying a particular frequency band of said mixed signals;

means, responsive to said selective amplifying means, for providing an indication when said amplified mixed signals exceed a predetermined threshold, said indication being indicative of the presence of a transmitter;

frequency counting means, responsive to said local signal for generating a digital indication of a frequency related to said local signal; and memory means responsive to said providing means and to said frequency counting means for storing said indication at an address corresponding to the frequency of said local signal giving rise to said indication.

14. An apparatus as claimed in claim 13 further comprising display means connected to said frequency counting means for displaying said frequency of said local signal.

15. An apparatus for detecting the presence of a transmitter comprising:

means for generating a scanning signal having a frequency;

means connected to said generating means for varying said scanning signal frequency;

means for receiving incoming signals;

means responsive to said generating means and said receiving means, for combining said incoming signals with said scanning signal to produce mixed signals;

means responsive to said combining means for selectively amplifying a particular frequency band of said mixed signals;

means responsive to said selective amplifying means for providing an indication when said amplified mixed signals exceeds a predetermined threshold, said indication being indicative of the presence of a transmitter;

control means responsive to said providing means and connected to said varying means for preventing said varying means from varying said scanning signal frequency;

restart means connected to said varying means for enabling said varying means to vary said scanning signal frequency;

frequency counting means responsive to said scanning signal frequency for generating a digital indication of said scanning signal frequency; and memory means responsive to said providing means and to said frequency counting means for storing said indication at an address corresponding to said scanning signal frequency giving rise to said indication.

16. An apparatus as claimed in claim 15 wherein said restart means is responsive to said memory means for automatically enabling said varying means if said indication has been previously stored at said address.

17. An apparatus for detecting the presence of a transmitter comprising:

first means for generating a fundamental signal having a varying frequency;

second means, responsive to said first means, for generating a plurality of harmonics of said fundamental frequency;

means for receiving incoming signals;

means responsive to said second generating means and receiving means, for combining said incoming signals with said fundamental and harmonic frequencies to produce mixed signals;

means for selectively amplifying a particular frequency band of said mixed signals;

means for providing an indication when said amplified mixed signals exceed a predetermined threshold, said indication being indicative of the presence of a transmitter;

control means, responsive to said providing means and connected to said first means for preventing said first means from varying the frequency of said fundamental signal;

restart means connected to said first means for enabling said first means to vary said fundamental frequency;

frequency counting means, responsive to said fundamental signal for generating a digital indication of the frequency of said fundamental signal; and memory means connected to said providing means and responsive to said frequency counting means for storing said indication at an address corresponding to the frequency of said fundamental signal giving rise to said indication.

18. An apparatus as claimed in claim 17 wherein said restart means is responsive to said memory means so that said memory means may automatically activate said restart means when said indication has been previously stored in said memory at an address corresponding to the frequency of said fundamental signal giving rise to said indication.

19. An apparatus for determining radio frequencies carrying signals which exceed a predetermined threshold comprising:

first means for generating a scanning signal consisting of frequency components related to a fundamental signal frequency;

means connected to said first generating means for varying said frequency components;

means for receiving incoming signals;

means responsive to said generating means and said receiving means for combining said incoming signals with said scanning signal to produce mixed signals;

means responsive to said combining means for selectively amplifying a particular frequency band of said mixed signals;

means responsive to said selective amplifying means for providing an indication when said amplified mixed signals exceed a predetermined threshold;

frequency counting means responsive to said fundamental signal frequency for providing a digital indication of said fundamental signal frequency;

memory means connected to said providing means and responsive to said frequency counting means for storing said indication at an address corresponding to said digital indication; and means for reading said memory for determining which of said addresses have indications stored therein, said addresses storing said indications being related to radio frequencies carrying signals.

20. An apparatus for monitoring predetermined frequencies for signals, the transmitted energy of which exceeds a predetermined threshold comprising:

memory means;

means connected to said memory means for loading first indications at addresses corresponding to first frequencies related to said predetermined frequencies;

first means for generating a scanning signal having a frequency;

means connected to said first generating means for varying said scanning signal frequency;

means for receiving incoming signals;

means responsive to said generating means and said receiving means for combining said incoming signals with said scanning signal to produce mixed signals;

means responsive to said combining means for selectively amplifying a particular frequency band of said mixed signals;

means responsive to said selective amplifying means for providing a second indication when said amplified mixed signals exceed a predetermined threshold;

means for reading said memory means at an address corresponding to said scanning signal frequency;

control means responsive to said providing means and said reading means and connected to said varying means for disabling said varying means if said first indication is present at said address corresponding to said scanning signal frequency and said second indication has been provided by said providing means; and means connected to said varying means for selectively re-enabling said varying means.

21. An apparatus for monitoring predetermined frequencies for signals the transmitted energy of which exceeds a predetermined threshold comprising:

a memory;

means connected to said memory means for loading first indications at addresses in said memory corresponding to first frequencies related to said predetermined frequencies;

first means for generating a fundamental signal having a base frequency;

second means responsive to said first generating means for generating a scanning signal consisting of a plurality of second frequencies related to said base frequency;

means for receiving input signals;

means responsive to said second generating means and said receiving means for combining said scanning signal and said input signals to produce mixed signals;

means for selectively amplifying a particular frequency band of said mixed signals;

means for providing a second indication when said amplified mixed signals exceed said predetermined threshold;

means responsive to said first generating means for reading said memory at an address corresponding to the frequency of said base frequency;

means responsive to said selective amplifying means for analyzing data contained in signals amplified by said selective amplifying means;

means connected to said first means for varying said base frequency;

control means responsive to said providing means and said reading means and connected to said varying means for disabling said varying means if said providing means provides said second indication and said reading means reads said first indication; and restart means connected to said varying means for re-enabling said varying means.

22. An apparatus as claimed in claim 21 wherein said second frequencies generated by said second generating means are harmonics of said base frequency.

23. An apparatus as claimed in claim 13, 17, 21 or 22 wherein said first means includes:

a pulse generator;

means for counting pulses produced by said pulse generator;

means for generating a voltage level related to the output of said counting means; and voltage controlled oscillating means for producing a control signal having a frequency related to the said voltage level.

24. An apparatus as claimed in claim 17, 21 or 22 wherein said first means comprises:
a clock for producing pulses; and
a gate having a control terminal responsive to said providing means, an input terminal connected to said clock and an output connected to said second generating means for selectively preventing transmission of said clock pulses to said output.

25. An apparatus as claimed in claim 13, 15, 17, 19, 20, 21, or 22 wherein said selective amplifying means comprises an IF amplifier.

26. An apparatus as claimed in claim 13, 15, 17, 19, 20, 21 or 22 wherein said selective amplifying means comprises:
an IF amplifier; and
means connected to said IF amplifier for rectifying the output of said IF amplifier.

27. An apparatus as claimed in claim 15, 17, 20, 21 or 22 wherein said control means comprises:

a monostable multivibrator having an input connected to said providing means and an output; and
an R-S flip-flop having an input connected to said monostable multivibrator output.

28. An apparatus as claimed in claim 13, 15, 17, 19, 20, 21 or 22 wherein said providing means comprises a voltage comparator.

29. An apparatus as claimed in claim 13, 15, 17, 19, 20, 21 or 22 further comprising a voltage reference source connected to said providing means for generating said predetermined threshold.

30. An apparatus as claimed in claim 29 wherein said voltage reference source is adjustable.

31. An apparatus as claimed in claim 13, 15 or 19 wherein said first means comprises:
a clock for producing pulses; and
a gate having a control terminal responsive to said providing means, an input terminal connected to said clock and an output connected to said frequency counting means for selectively preventing transmission of said clock pulses to said output.

* * * * *